(12) United States Patent
Adkisson et al.

(10) Patent No.: US 7,781,781 B2
(45) Date of Patent: Aug. 24, 2010

(54) CMOS IMAGER ARRAY WITH RECESSED DIELECTRIC

(75) Inventors: James W. Adkisson, Jericho, VT (US); Jeffrey P. Gambino, Westford, VT (US); Zhong-Xiang He, Essex Junction, VT (US); Mark D. Jaffe, Shelburne, VT (US); Robert K. Leidy, Burlington, VT (US); Stephen E. Luce, Underhill, VT (US); Richard J. Rassel, Colchester, VT (US); Edmund J. Sprogis, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 734 days.

(21) Appl. No.: 11/560,882

(22) Filed: Nov. 17, 2006

(65) Prior Publication Data

US 2008/0116537 A1    May 22, 2008

(51) Int. Cl.
*H01L 27/15* (2006.01)
(52) U.S. Cl. ........... 257/84; 257/E27.131; 257/E27.132
(58) Field of Classification Search .................. 257/222, 257/225, 232, 233, 432, 433, 59, 72, 84, 257/E27.131, E27.132
See application file for complete search history.

(56) References Cited

U.S. PATENT DOCUMENTS

| | | | |
|---|---|---|---|
| 6,274,917 B1 | 8/2001 | Fan et al. | |
| 6,608,679 B1 | 8/2003 | Chen et al. | |
| 6,611,037 B1 | 8/2003 | Rhodes | |
| 6,818,934 B1 | 11/2004 | Yamamoto | |
| 6,911,684 B2 | 6/2005 | Yamamoto | |
| 6,930,336 B1 | 8/2005 | Merrill | |
| 6,933,167 B2 | 8/2005 | Yamamoto | |
| 7,364,933 B2 * | 4/2008 | Kim | ............................ 438/65 |
| 2005/0002107 A1 | 1/2005 | Nemoto | |
| 2005/0017278 A1 | 1/2005 | Yamamoto | |
| 2005/0048690 A1 | 3/2005 | Yamamoto | |
| 2005/0082480 A1 | 4/2005 | Wagner et al. | |
| 2006/0038254 A1 | 2/2006 | Jin | |

* cited by examiner

*Primary Examiner*—Quoc D Hoang
(74) *Attorney, Agent, or Firm*—Scully, Scott, Murphy & Presser, P.C.; Richard M. Kotulak, Esq.

(57) ABSTRACT

A CMOS image sensor array and method of fabrication. The CMOS imager sensor array comprises a substrate; an array of light receiving pixel structures formed above the substrate, the array having formed therein "m" levels of conductive structures, each level formed in a corresponding interlevel dielectric material layer; a dense logic wiring region formed adjacent to the array of light receiving pixel structures having "n" levels of conductive structures, each level formed in a corresponding interlevel dielectric material layer, where n>m. A microlens array having microlenses and color filters formed above the interlevel dielectric material layer, a microlens and respective color filter in alignment with a respective light receiving structure formed at a surface of the substrate. A top surface of the interlevel dielectric material layer beneath the microlens array is recessed from a top surface of the interlevel dielectric material layers of the dense logic wiring region.

11 Claims, 9 Drawing Sheets

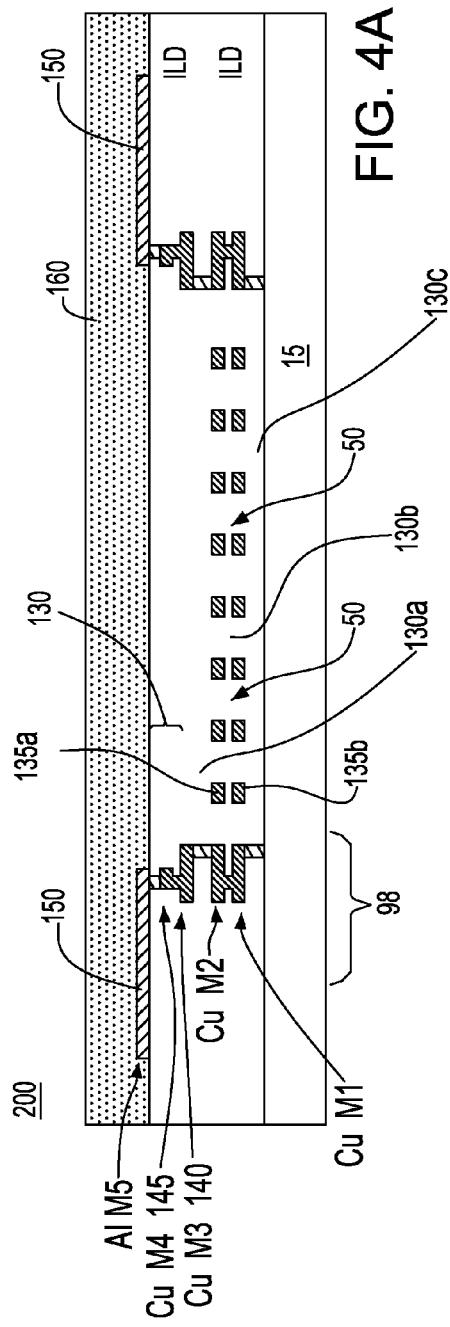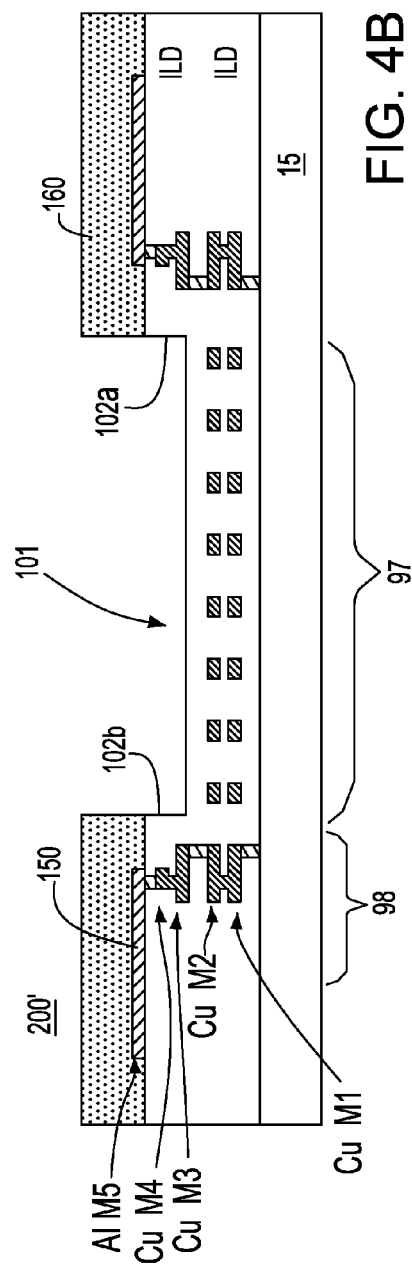

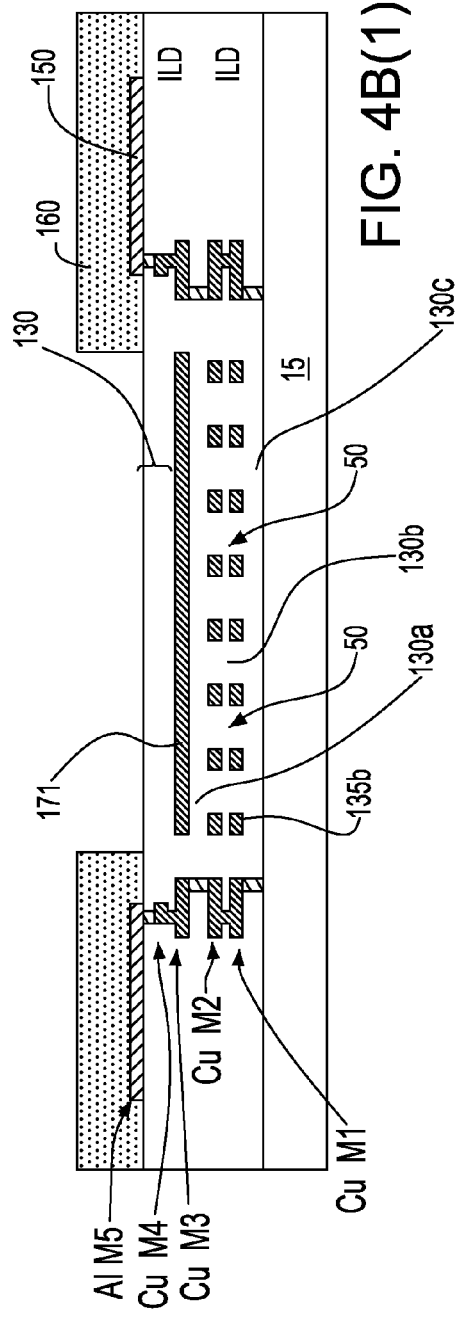
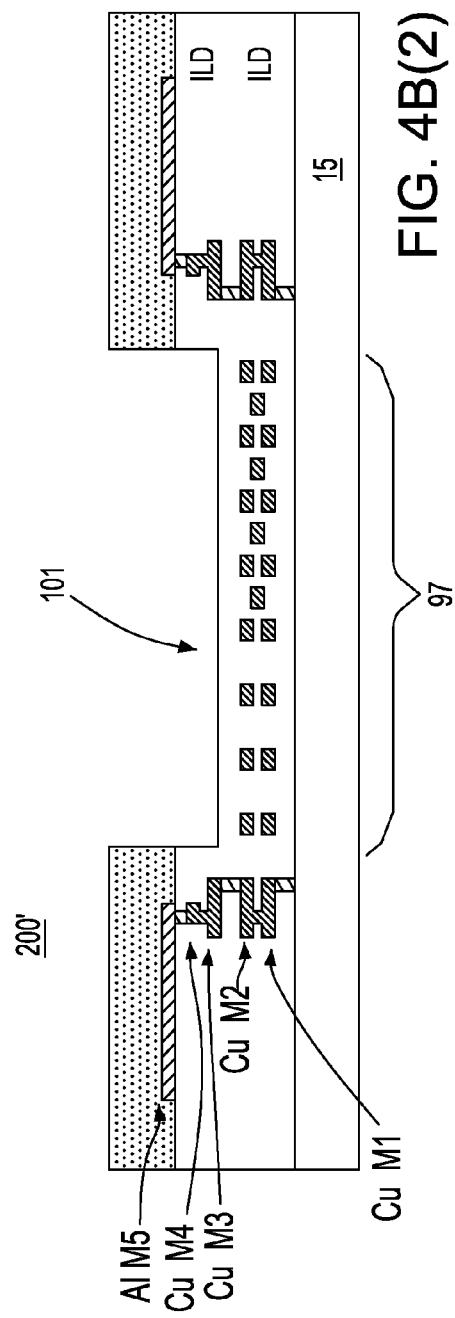

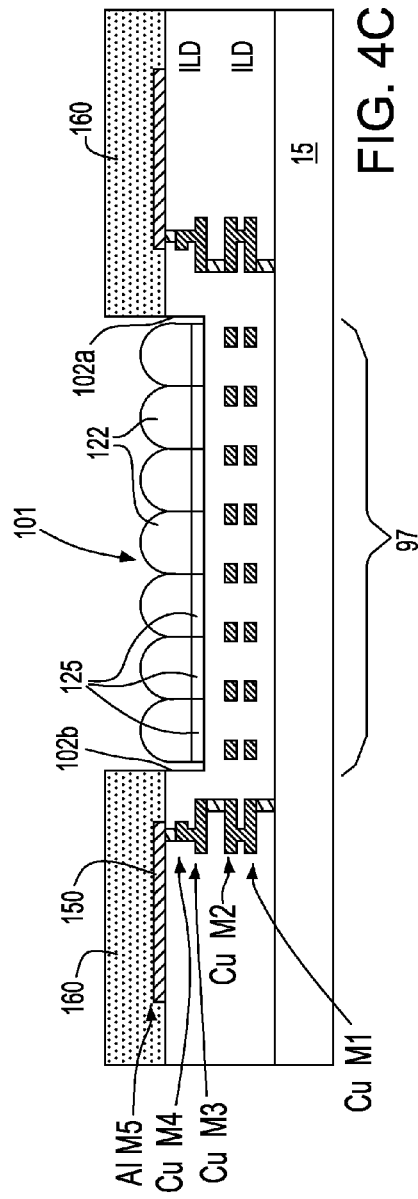
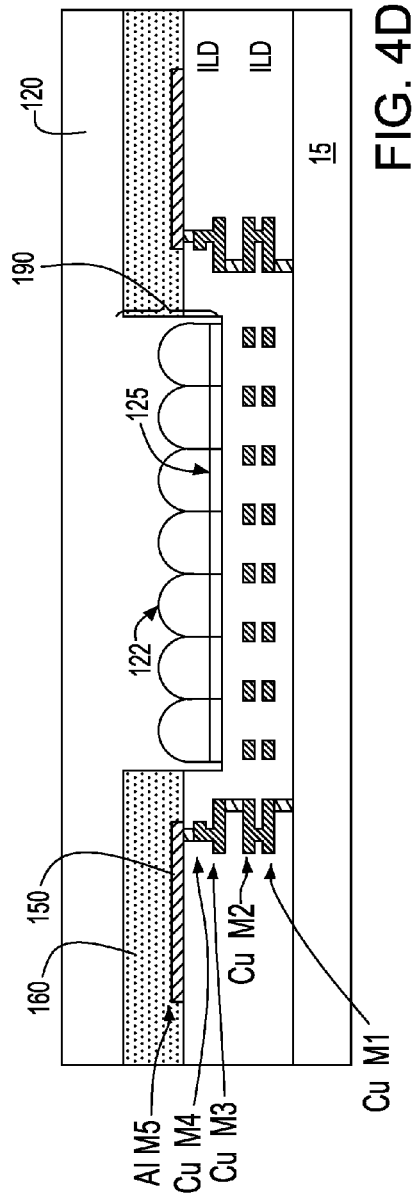

CMOS IMAGER ARRAY WITH RECESSED DIELECTRIC

FIELD OF THE INVENTION

The present invention relates to semiconductor optical image sensors, and particularly, to a novel CMOS (complementary metal oxide semiconductor) image sensor array structure having a recessed dielectric thereby exhibiting reduced reflectivity and increased light sensitivity, and a process for manufacturing such image sensor array.

DESCRIPTION OF THE PRIOR ART

CMOS image sensors are beginning to replace conventional CCD sensors for applications requiring image pick-up such as digital cameras, cellular phones, PDA (personal digital assistant), personal computers, and the like. Advantageously, CMOS image sensors are fabricated by applying present CMOS fabricating process for semiconductor devices such as photodiodes or the like, at low costs. Furthermore, CMOS image sensors can be operated by a single power supply so that the power consumption for that can be restrained lower than that of CCD sensors, and further, CMOS logic circuits and like logic processing devices are easily integrated in the sensor chip and therefore the CMOS image sensors can be miniaturized.

Current CMOS image sensors comprise an array of CMOS Active Pixel Sensor (APS) cells, which are used to collect light energy and convert it into readable electrical signals. FIG. 1 depicts an array 10 of CMOS Active Pixel Sensor (APS) cells 20 according to the prior art. As shown, the array 10 comprises a plurality of microlenses 22, each having a hemispherical shape, arranged on a smooth planarization layer 27, e.g., a spin on polymer, that is formed on top of a color filter array 13 enabling formation of the microlens array. The color filter array 13 includes individual red, green and blue filter elements 25 (primary color filters) or alternately, cyan, magenta and yellow filter elements (complementary color filter). Each microlens 22 of the imager pixel array 10 is aligned with a corresponding color filter element 25 and comprises an upper light receiving portion of a pixel 20. The pixel 20 includes an APS cell portion fabricated upon a semiconductor substrate 15 that is used to collect light energy 14 and convert it into readable electrical signals. The APS cell portion further includes a light sensitive element, e.g., a photosensing device 18 such as a photodiode that performs a photoelectric conversion, and one or more CMOS transistors (not shown) that perform charge amplification, switching and read-out. Each of the pixels 20 generates a signal charge corresponding to the intensity of light received by each pixel that is converted to a signal current by the photoelectric conversion element (e.g., photodiode) formed on semiconductor substrate 15. In operation, the photosensing device 18, such as a photodiode, photogate, or photoconductor, overlies a doped region of a substrate for accumulating photo-generated charge in an underlying portion thereof. A read-out circuit is connected to each pixel cell and often includes a floating diffusion region for receiving charge from the photosensitive element, when read-out. Typically, this is accomplished by a transistor device, e.g., a source follower transistor circuit, having a gate electrically connected to the floating diffusion region. The imager may also include a transistor, having a transfer gate, for transferring charge from the photosensitive element across a surface channel to the floating diffusion region, and a transistor for resetting the floating diffusion region to a predetermined charge level prior to charge transfer.

The above-described APS cell portion is fabricated upon a semiconductor substrate 15 underneath a stack comprising one or more interlevel dielectric material layers 30a-30c each comprising an organic or inorganic interlevel dielectric (ILD) material incorporating metallization interconnect levels M1, M2 Aluminum (Al) or Copper (Cu) wire layers 35a, 35b. Interlevel dielectric materials may comprise a polymer or $SiO_2$, for example. As Al metallization interconnect layers 35a, 35b do not require passivation, no respective barrier layers are shown. It is understood that metallization interconnect levels M1, M2 may comprise copper (Cu) conductors which enable a thinner interlevel dielectric stack as these metallization levels of copper have respective ultra-thin barrier layer portions in the pixel cell optical path or, alternately, removed from the pixel cell optical path to thereby increase the sensitivity of the pixel cell.

Each APS cell 20 having the conductive metallizations 35a,b further includes a final metal level 36 (e.g., Al) that enables wire bonding to the M1 and M2 metallizations between each pixel 20. A final passivation layer 29 is formed above the wire bonding level 36 that may comprise SiN, $SiO_2$, or combinations of these.

FIG. 2 depicts, through a cross-sectional view, a prior art CMOS image sensor 10' as in FIG. 1, however depicted at the wafer package level including a bonded top glass plate structure 11 and chip lead structure 89. It is seen in FIG. 2 the pixel's arrays structure 20 including the microlens and color filters, relative to the formed logic carrying conductors, i.e., copper metallization levels M1, M2, that are interface with pixel (CMOS) processing circuits inside the chip and, additionally, interface to circuits outside the chip via the package lead structure 89 by connecting with a bond pad structure 88.

Thus, it is apparent that CMOS imagers offer the possibility of integration with logic chips, to thereby reduce the number of chips required in the system. However, the requirements for wiring of dense logic circuits is different from that of imagers. Dense logic circuits require many of levels of metal (typically >4) whereas CMOS image sensors require a minimal number of metal levels (typically <4) to maximize optical response. Therefore, a process is required to simultaneously optimize the wiring in both the imager array and the logic circuits on CMOS imager chips.

SUMMARY OF THE INVENTION

The present invention is directed to a CMOS image sensor having a pixel array sensor portion that is thinner in a pixel array region compared to more dense logic wiring regions of the sensor. This allows the logic circuits to have as many metal levels as necessary to provide a dense layout, while still allowing the imager array to have a thin dielectric stack.

Thus, the height of the corresponding metal levels and interlevel dielectric levels of the dense wiring logic regions for the CMOS imager device that are formed adjacent the pixel array region is greater than the height of metallization levels and interlevel dielectric levels pixel array region.

That is, in one embodiment, a top surface of the interlevel dielectric material layer beneath the microlens array is recessed from a top surface of the interlevel dielectric material layers of the dense logic wiring region.

In some designs, the corresponding height of the metal levels of the dense logic wiring region for the CMOS imager device may be 30% greater than the height of the imager cell array.

The method of fabricating a CMOS image sensor having a film stack that is thinner in the pixel array region as compared to the dense wiring logic regions of the chip results in a pixel array exhibiting increased light sensitivity.

Thus, according to one aspect of the invention, there is provided a CMOS imager sensor array and method of fabrication. The CMOS imager sensor array comprises:

a substrate;

an array of light receiving pixel structures formed above the substrate, the array having formed therein "m" levels of conductive structures, each level formed in a corresponding interlevel dielectric material layer; and, a dense logic wiring region formed adjacent to the array of light receiving pixel structures having "n" levels of conductive structures, each level formed in a corresponding interlevel dielectric material layer, where n>m.

A microlens array having microlenses and color filters is formed above the interlevel dielectric material layer, a microlens and respective color filter in alignment with a respective light receiving structure formed at a surface of the substrate.

In one exemplary embodiment of the imager array, m=2 and n≧4.

In another exemplary embodiment of the imager array, m≦4 and n≧4.

According to a further aspect of the invention, there is provided a method for fabricating an image sensor array of pixels comprising:

forming a plurality of light sensitive elements in a semiconductor substrate to form a pixel array region of the sensor array;

forming a stack of "m" interlevel dielectric material layers atop the substrate in both the pixel array region of the sensor array and an adjacent dense wiring logic region of the sensor array, each the "m" interlevel dielectric material layers including a respective metal interconnect level comprising a conductor structure in both the pixel array region of the sensor array and the adjacent dense wiring logic region of the sensor array;

forming a stack of additional interlevel dielectric layers atop the "m" interlevel dielectric material layers over both the pixel array region and the dense logic wiring region, the stack of additional interlevel dielectric layers formed in the adjacent dense logic wiring region including respective additional metal interconnect levels including additional metal level conductor structures formed only in the adjacent dense logic wiring region, wherein a total of "n" metal interconnect levels having conductive structures is formed in the adjacent dense logic wiring region, wherein n>m;

removing a portion of the additional interlevel dielectric layers formed atop pixel array region whereby a surface of the additional interlevel dielectric layers in the pixel array region is recessed from a top surface of the additional interlevel dielectric material layers of the dense logic wiring region; and, forming a microlens array having microlenses and color filters above the recessed surface of the interlevel dielectric material layer in the pixel array region, a microlens and respective color filter in alignment with a respective light sensitive element.

Advantageously, the image sensor array of pixels formed in accordance with the method of the invention easily lends itself to conventional wafer level packaging in both Schott package and Shellcase package configurations.

BRIEF DESCRIPTION OF THE DRAWINGS

The objects, features and advantages of the present invention will become apparent to one skilled in the art, in view of the following detailed description taken in combination with the attached drawings, in which:

FIGS. 4A-4F illustrate, through cross-sectional views, the methodology for fabricating a CMOS image sensor array 100 having recessed dielectric and top glass enclosure according to the invention with alternate process flows depicted in FIGS. 4E and 4F;

DETAILED DESCRIPTION OF PREFERRED EMBODIMENTS

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

Figure 1:
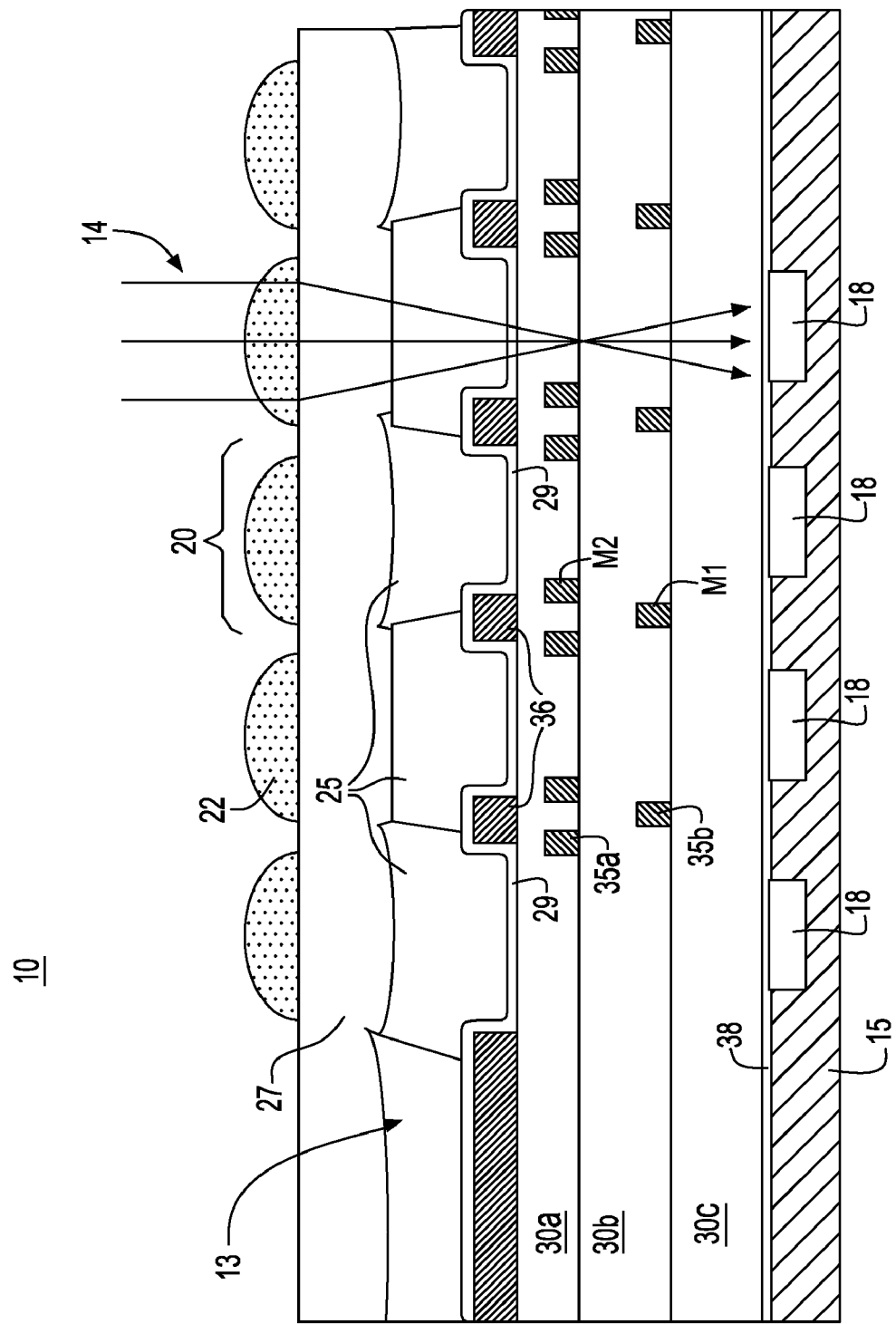
FIG. 1 depicts a CMOS image sensor pixel array 10 according to the prior art.
Figure 2:
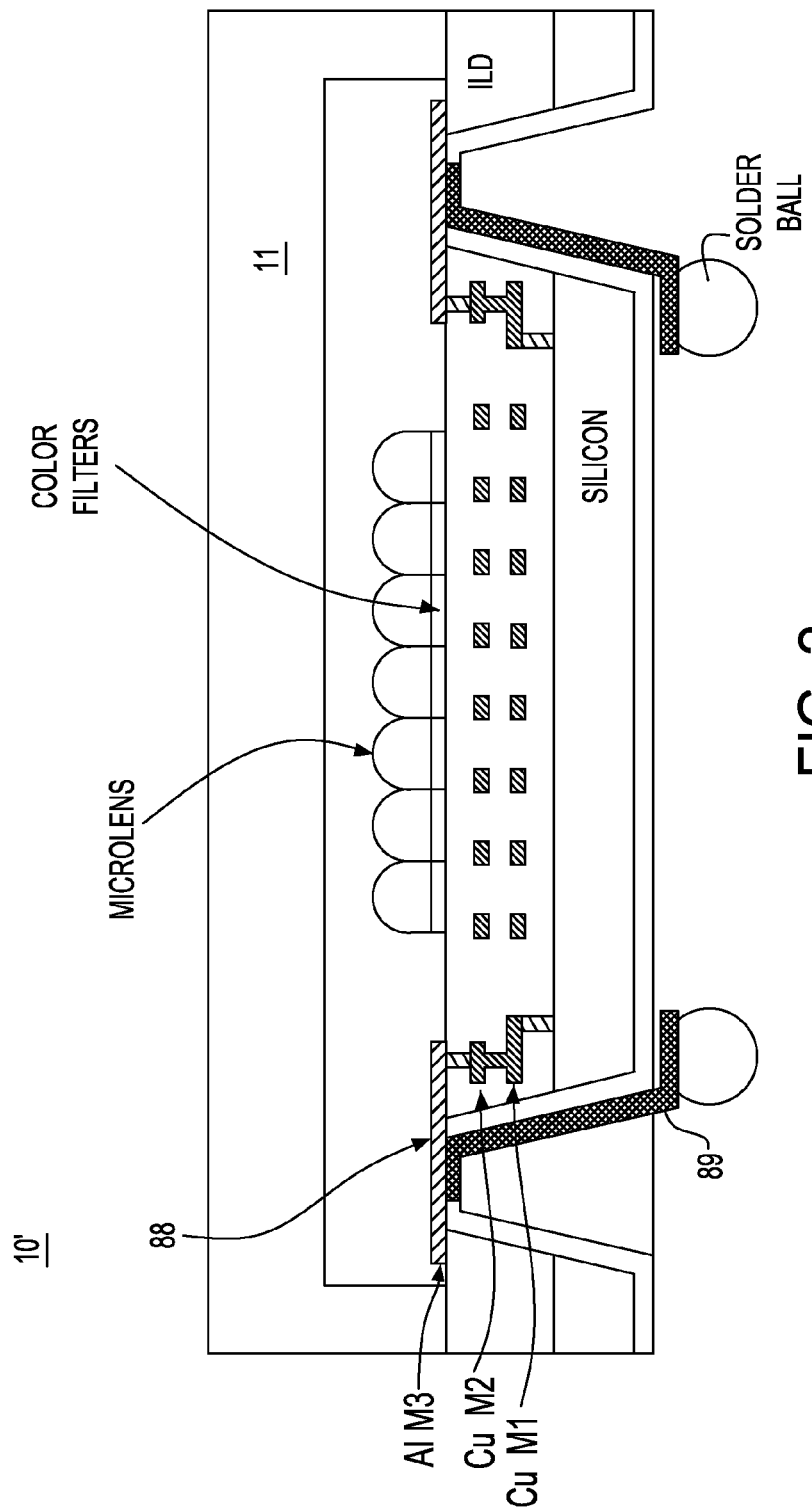
FIG. 2 depicts, through a cross-sectional view, the prior art CMOS image sensor 10' as in FIG. 1, however depicted at the wafer package level including top glass enclosure and chip lead structures.
Figure 3:
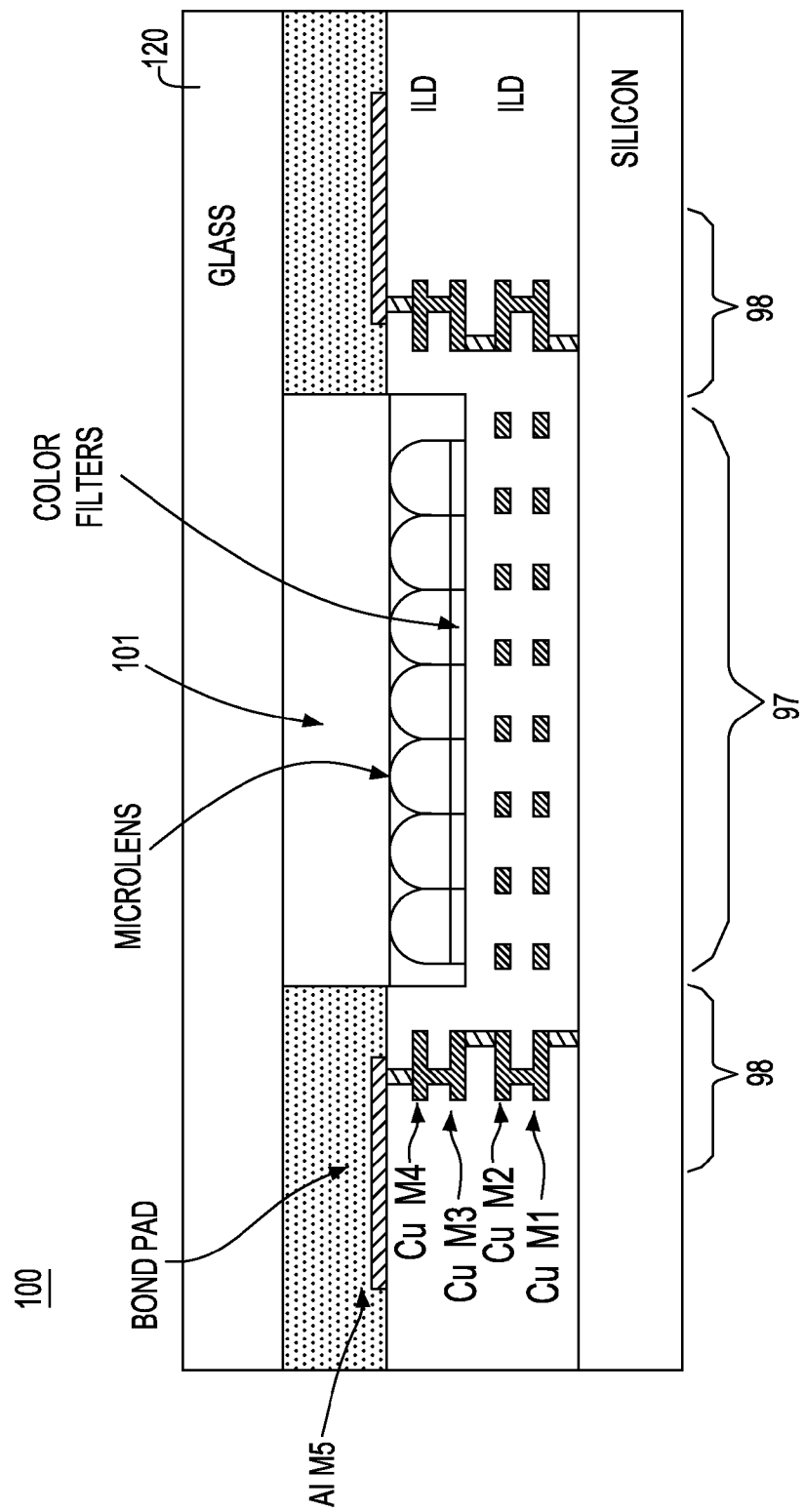
FIG. 3 illustrates, through a cross-sectional view, the CMOS image sensor array 100 having a recessed dielectric and top glass enclosure according to the invention.

FIG. 3 illustrates, through a cross-sectional view, the CMOS image sensor chip 100 having a recessed dielectric according to a first embodiment of the invention. In this embodiment, the CMOS imager array 100 includes a recessed dielectric structure 101 in which is formed the array of color filters and corresponding microlens structures. The recess 101 particularly protects lenses during the process of bonding the glass plate 120 to the CMOS sensor array chip. Essentially, standard devices and wiring are fabricated, however, upper wiring layers are not formed over imager array 100 microlens structures. Thus, as will be described, the array 10 includes a plurality of metal wiring layers M1-M5 interconnected by vias, for example, formed at dense wiring regions 98 of the peripheral circuits where at least five (M1-M5) metallization levels are fabricated. This is compared to the active pixel region 97 formed between dense wiring regions 98 of the imager chip where only up to two metallization levels (M1-M2) and interlevel dielectrics are formed. It is noted that conventional damascene or subtractive etch techniques may be used to form the metal structures and via structures that interconnect the metal level structures M1-M5 in the dense wiring regions 98.

FIGS. 4A-4E depict, through cross-sectional views, a process for fabricating the CMOS image sensor array structure 100 of FIG. 3 according to the invention. Standard processing yields the intermediate sensor stack structure 200 shown in FIG. 4A as now described. Particularly, there is formed Cu metallization interconnects M1, M2 allowing for the formation of thinner stack of interlevel dielectric layers 130a-130c formed on the substrate 15. The substrate 14 may be a bulk semiconductor including, for example, Si, SiGe, SiC, SiGeC, GaAs, InP, InAs and other III-V compound semiconductors, II-V compound semiconductors, or layered semiconductors such as silicon-on-insulators (SOI), SiC-on-insulator (SICOI) or silicon germanium-on-insulators (SGOI). Preferably, the interlevel dielectric material may comprise an organic or inorganic interlevel dielectric (ILD) material which may be deposited by any of number of well known techniques such as sputtering, spin-on, or PECVD and may include a conventional spun-on organic dielectrics, spun-on inorganic dielectrics or combinations thereof which have a dielectric constant of about 4.2 or less. Suitable organic dielectrics that can be employed in the present invention include dielectrics that comprise C, O, F and/or H. Examples of some types of organic dielectrics that can be employed in the present invention include, but are not limited to: aromatic thermosetting polymeric resins, for example, resins sold by DOW Chemical Company under the tradename SiLK®, Honeywell under the tradename Flare®, and similar resins from other suppliers, and other like organic dielectrics. The organic dielectric employed as interlevel dielectric layers may or may not be porous, with porous organic dielectric layers being highly preferred due to the reduced k value. Suitable inorganic dielectrics that may be employed as the interlevel dielectric typically comprise Si, O and H, and optionally C, e.g., $SiO_2$, FSG (fluorosilicate glass), SiCOH, SiOCH, carbon-doped oxides (CDO), silicon-oxicarbides, organosilicate glasses (OSG) deposited by plasma enhanced chemical vapor deposition (CVD) techniques. Illustrative examples of some types of inorganic dielectrics that can be employed include, but are not limited to: the silsesquioxane HOSP (sold by Honeywell), methylsilsesquioxane (MSQ), hydrogen silsesquioxane (HSQ), MSQ-HSQ copolymers, $SiO_2$ deposited using tetraethylorthosilicate (TEOS) or $SiH_4$ as a silicon source and $O_2$, $N_2O$, NO, etc. as an oxidizer; organosilanes and any other Si-containing material. For purposes of discussion it is assumed that the inorganic dielectric material is $SiO_2$.

Referring further to FIG. 4A, the methodology for forming the M1 layer includes first depositing the $SiO_2$ dielectric layer 130c, e.g., to a thickness ranging between about 2 kÅ to 20 kÅ with a range of between 3 kÅ and 4 kÅ preferred, on top of the substrate which may include a capping layer (not shown), patterning trenches in the $SiO_2$ layer 130c using known lithography and RIE techniques, and, lining the formed trenches with a metal liner such as one or more refractory metals, e.g., Ta, TaN, TiN, TiSiN, W, WCN, Ru. Then, the lined trenches are filled with a copper material to form the Cu M1 layer 135b which is subsequently polished using known CMP technique. Thereafter, a barrier layer (not shown), such as SiN, may be deposited on top of the Cu M1 metallization 135b, e.g., to a thickness ranging between about 20 Å to 2 kÅ with a range of between 100 Å and 200 Å preferred. In this embodiment, the thickness of the nitride layer on top of the Cu interconnect is reduced to minimize reflectance. It is understood that other barrier layers materials may be used including, but not limited to, SiON, SiC, SiCN, SiCON, SiCO materials etc. The process is repeated for the subsequent Cu M2 metallization layer whereby a thin M2 dielectric layer 130b, e.g., $SiO_2$, is deposited over the Cu diffusion layer to a thickness ranging between about 2 kÅ to 20 kÅ, preferably 1 micron, and then the M2 metallization layer is formed by patterning trenches in the $SiO_2$ layer 130b using known lithography and RIE techniques, lining the formed trenches with a metal liner such as a refractory metal, and, filling the lined trenches with a copper material to form the Cu M2 135a layer which is subsequently polished using known CMP technique. Thereafter, a barrier or Cu diffusion layer (not shown), such as SiN, may be deposited on top of the Cu M2 layer 135a, e.g., to a thickness ranging between about 20 Å to 2 kÅ.

It is preferred that, in the embodiment depicted in FIG. 4A, the total thickness of both the M1 and M2 diffusion barriers be about 20 nm or less, in order to minimize reflectance. Further to the embodiment depicted in FIG. 4A, it should be understood that an additional layer of materials with an index of refraction that is in between that of SiN (1.98) and $SiO_2$ (1.46), such as SiON, can be formed on top of the thin SiN barrier layers to comparable thicknesses (e.g., about 20 Å to 2 kÅ) to further reduce reflections. According to this first embodiment, the provision of Cu metallization and corresponding thin interlevel dielectric layers 130a-130c and minimum diffusion barrier layers (not shown) in the optical path minimizes light reflectance, thus allowing greater amounts of light 14 to flow through the optical path of pixel 20 and reach underlying photodiode 18. Although not shown, in an alternate embodiment, each pixel of array 100 may include an additional STI isolation dielectric region formed in the substrate on top of the light sensitive element, e.g., photodiode. In this alternate embodiment, a bottom nitride capping layer is removed from the pixel optical path.

In a further embodiment, those portions of the barrier SiN layers formed in the pixel array optical paths are selectively removed to avoid the refraction index mismatch problem. In this embodiment of the CMOS image sensor array 100, an additional mask (a resist mask or a hardmask) are used at each level of processing to create openings 50 in the SiN barrier layers at the location of each pixel's optical path. That is, after each respective barrier layer is formed, an additional lithography patterning and etching step (wet or dry etch) is implemented to open up the SiN at the select locations. It is understood however, that a maskless process may be implemented for removing select portions of the SiN layers, e.g., using clustered ion beam etching. Preferably, a fluorine-based dry etch (e.g., $CF_4$ plus an oxygen plasma), however, a wet etch is desirable to minimize damage or roughness at the surface after the etch (which might cause reflections or scattering of the light). The wet etch may comprise of a dilute HF "smoothing" etch after SiN RE, or it could be an $H_3PO_4$ etch to remove the SiN, using $SiO_2$ as a hardmask. Thus, in this embodiment, process steps of forming the interlevel dielectric layer 130c, the Cu M1 metallization layer 135b, and corresponding SiN barrier layer deposition is conducted, and selective removal of the barrier SiN layer in the pixel array optical path is performed. These process steps are then repeated to form the subsequent M2 dielectric 130b, metal layer M2 135a and the M2 Cu barrier layer. After the M1 SiN barrier layer is etched, however, the surface of that layer may not be perfectly flat which may compromise the subsequent formed M2 dielectric and, potentially effect the lithography or the polishing of the subsequent conductor metal, e.g., Cu, for the subsequent M2 level 135a. Thus, after the ILD layer 130b (e.g., $SiO_2$) for the M2 level is patterned and deposited, an additional polishing step is performed at the surface of the $SiO_2$ dielectric 130b level before the M2 metallization 135a is patterned and formed.

Continuing, the steps described herein with respect to forming the ILD layers 130c and 130b and metallization levels M1, M2 are repeated to yield a further interlevel dielectric layer 130a formed on top of the M2 Cu interconnect diffusion layer (not shown) and further corresponding metallization level M3, and, a further interlevel dielectric layer 130 and further corresponding metallization level M4. As shown in FIG. 4A however, each of the M3 and M4 metallization layers include M3 and M4 conductive structures 140, 145, respectively, formed at the dense wiring logic regions 98 of the chip and are not formed over the M1 and M2 metallizations that reside at each pixel between the defined active pixel sensor optical paths of the imager array.

The next step involves the formation of fifth metallization level M5 including a conductor 150 (e.g., an aluminum conductor) that may electrically couple any logic circuitry (not shown) with the package lead used to connect to an external circuit and/or chip. As in the formation of metallization levels M3 and M4, and respective interconnecting conductive vias, the conductive structure 150 of metallization level M5 is formed at the dense wiring logic regions 98 of the chip and are not formed directly over the M1 and M2 metallizations that reside between the defined active pixel sensor optical paths of the imager array region 97. Further formed is a passivation layer 160 formed of one or more dielectric materials, such as $SiO_2$, SiN, or polyimide on top of the last dielectric level 130 to insulate the conductors 150 of the M5 metallization. This passivation layer will be subsequently etched to form a pair of pads that form the structure used to bond a protective covering, e.g., a glass plate, on top of the array and are typically 0.5 microns to 50 microns in thickness. Thus, in view of the intermediate structure 200 shown in FIG. 4A, it is clear that the upper wiring layers, e.g., layers M3-M5, are not formed over the imager array as the metallizations M1, M2.

Continuing to FIG. 4B, there is depicted through cross-sectional view, the resulting structure 200' after the final M5 metal level is processed, and a trench 101 is etched in the interlevel dielectric layer stack in the imager array region 97 using conventional lithography and RIE. This may be performed with an additional mask or, it can be part of a final via process. For instance, this may comprise steps depositing a passivation of last metal level M5, forming openings over bond pads and over the array, etching passivation over bond pads and at the same time forming the recess over the pixel array, and stripping the remaining resist. Particularly, the passivation layer 160 and the interlevel dielectric layer 130 are etched to form a trench or opening 101 having a width and length commensurate with the area of the image sensor pixel array to be formed, i.e., aligned with and disposed above the optical paths of a plurality of pixels and providing a surface upon which the color filters and microlens array are subsequently formed. It is seen from FIG. 4B that the sidewalls 102a, b of the trench opening 101 are inset a small distance from the formed metallizations M3-M4 and self-aligned with edges of the passivation layer 160. This small inset defines a peripheral region 98 where more dense logic circuitry is formed so as not to interfere with the active pixel cell array in region 97. More particularly, a photolithographic mask is subsequently patterned above the formed passivation layer 160 and developed and etched to open up the trench 101 corresponding in area spreading across a plurality of pixels in a subsequent single step etch process. A wet or dry etch process (e.g., a F-based dry etch) as known in the art may be used to create the trench 101 by effectively removing a portion of the overlying bond pad layer and that portion of the interlevel dielectric layer 130 above the third ILD layer 130a corresponding to metallization level M2 in the manner as shown in FIG. 4B. As depicted in FIG. 4B, the ILD dielectric is etched to a predetermined depth above the surface of the third ILD layer 130a. If an RIE etch is used, then standard parallel plate, downstream plasma, or high density plasma chambers could be used with perfluorocarbon (PFC) and/or hydrofluorocarbon (HFC) gases used as a fluorine source and oxygen, hydrogen, nitrogen, argon, etc. used as dilutant gases, as known in the art. If a wet etch is used, then dilute hydrofluoric acid could be used to etch the ILD material (e.g., $SiO_2$ or similar oxide films); phosphoric acid could be used to etch SiN or similar films, etc. as known in the art. The opening 101 formed in the structure shown in FIG. 4B pixel may be of the order of about 0.2 μm-4.0 μm deep, and of the order of about 1 mm-10 mm wide. The etched opening 101 is shown in FIG. 4B to be substantially parallel but may be slightly tapered (e.g., having a wider top opening than bottom).

In a more specific implementation for forming the a trench 101, in the process for forming the standard devices and wiring wherein the upper wiring layers are not formed over the imager array, as shown in FIG. 4B(1) there is formed an M3 etch stop layer 171 formed on top of the third ILD level 130a extending substantially across the length of said pixel array region 97. The etch stop layer 171 provides mechanical protection for underlying layers and/or structures but additionally provides chemical and/or ion protection, among other things, for example. Additionally, layer 171 may also include one or more layers including materials such as, but not limited to: copper, aluminum, silicon nitride, silicon carbide, silicon oxynitride, silicon oxide, silicon dioxide, silicon carbonitride, organic polymers such as polyimide and/or other materials, for example. By way of example only and not limitation, layer 171 can be formed to a thickness of between about 20 to about 100 nanometers. As shown in FIG. 4B(1), the additional interlevel dielectric layer 130 is formed above the etch stop layer 171 corresponding to metallization level M3 which may include an oxide based material formed to between about 50 to about 500 nanometers, for example. Then, as depicted in FIG. 4B(2), an etch process (a wet or a dry etch such as RIE) of the ILD 130 layer is performed that stops at the etch stop layer 171 according to known techniques. The etch stop layer 171 can be removed by conventional etch techniques as shown in FIG. 4B(2) resulting in the structure 200' shown in FIG. 4B(2) having the recessed dielectric. If the etch stop is a dielectric such as SiN, it can be left in the stack to provide protection to the underlying wires.

FIG. 4C illustrates, through a cross-sectional view, the resulting structure after the recess etch and formation of color filters 125 and microlens array 122 arranged along the X- and Y-directions thereon to form a two-dimensional image sensor array over image area 97 by conventional processing. Particularly, each pixel of the image sensor comprises a color filter 125 of colorant material (e.g., RGB (primary color filters) or cyan, magenta and yellow filters (complementary color filters)), which, in one embodiment, may comprise a negative photoresist based on an acrylic polymer material including color pigments that is formed on the third ILD layer 130a using known techniques. In this embodiment, an over coat layer may be formed on the resulting color filter layer(s) 125 and on any exposed surfaces of the third interlevel dielectric dielectric film to planarize the topography associated with the color filters. This planarizing layer is typically an organic material, such as resist, with a thickness ranging from 0.2 μm to 2.0 μm. The microlens structures of the microlens array 122 is then formed thereover by conventional techniques. Each microlens structure has a spherical surface and is regularly arranged along the X- and Y-directions to form a two-dimensional array in alignment with a color filter. Conventional techniques for forming the microlens structure 122 may be performed, e.g., forming a transparent insulating material, e.g., silicon-nitride, that is etched to form microlenses 122.

Figure 4E:
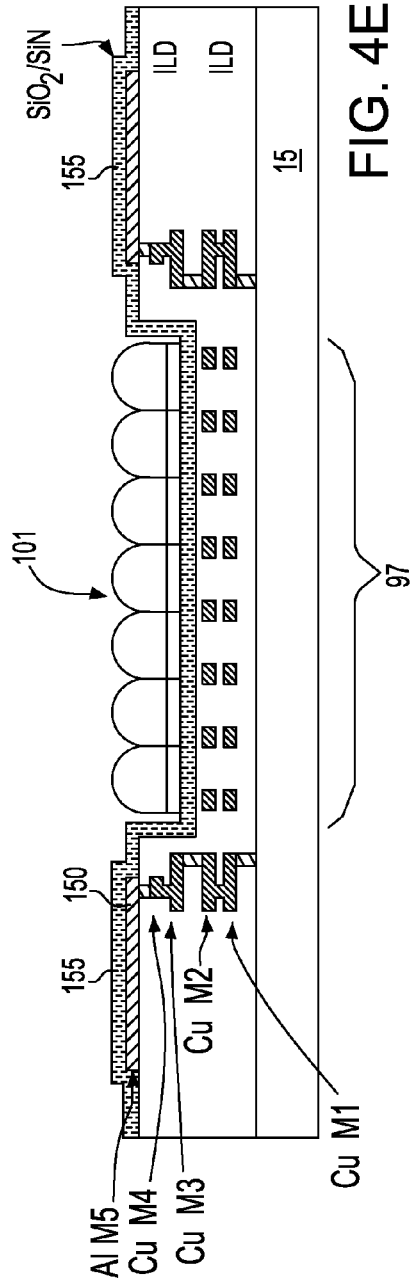
Figure 4F:
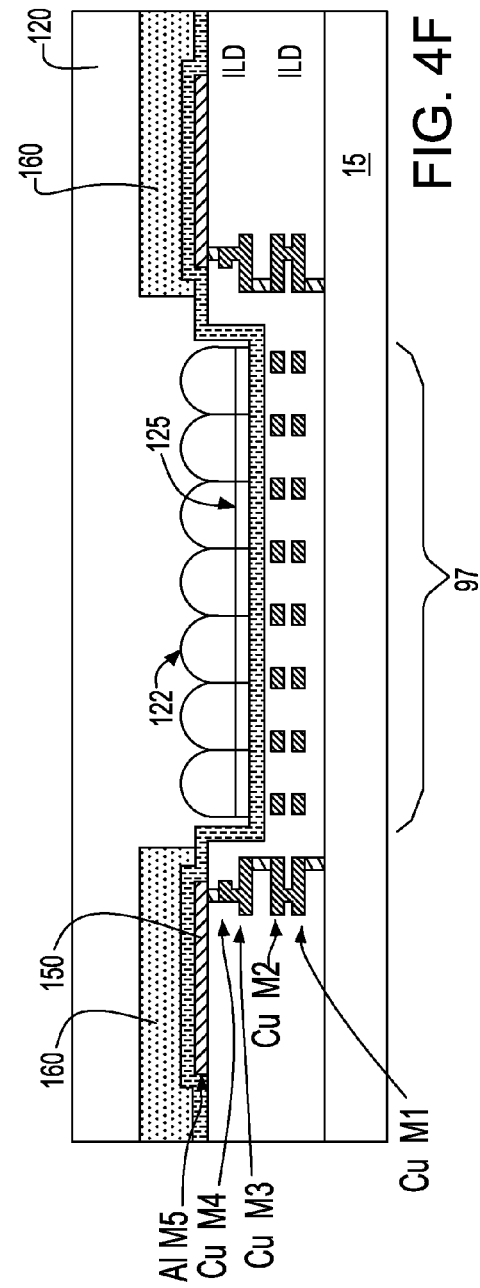

An alternate process flow (FIGS. 4E and 4F) is as follows: After fabricating the final metal layer, M5, the dielectric is removed over the array using lithography and RIE. Then, one or more inorganic passivation layers 155 such as SiN or $SiO_2$/SiN are deposited over the structure, which protects the underlying circuits from contamination. The total thickness of the inorganic dielectric ranges from 0.1 μm to 1 μm. Next, the color filters and microlenses are formed as shown in FIG. 4E. Finally, the polyimide spacers 160 are formed over the peripheral circuits, and the glass plate 120 is then attached to the polyimide 160 as shown in FIG. 4F.

Continuing to FIG. 4D there is depicted the step of bonding a glass plate 120 to the previously formed (polyimide) passivation layers 160 using a bonding cement such as an acrylic adhesive with optimized optical performance and curing properties. As shown in FIG. 4D, an air gap 190 of similar thickness as the bond pad structure 125, is created between the microlens array 122 and the packaging glass. Typically, the height of the air gap ranges from 2 μm up to 50 μm, to ensure that the defects on the surface of the glass do not touch the microlenses and that these defects are not imaged by the sensor. It is understood that the recess 101 is of such a depth that the formed lenses 125 are particularly protected during the process of bonding the glass plate 120 to the CMOS sensor array chip. The glass plate to be bonded may range from between about 400 microns-600 microns in thickness.

Figure 5:
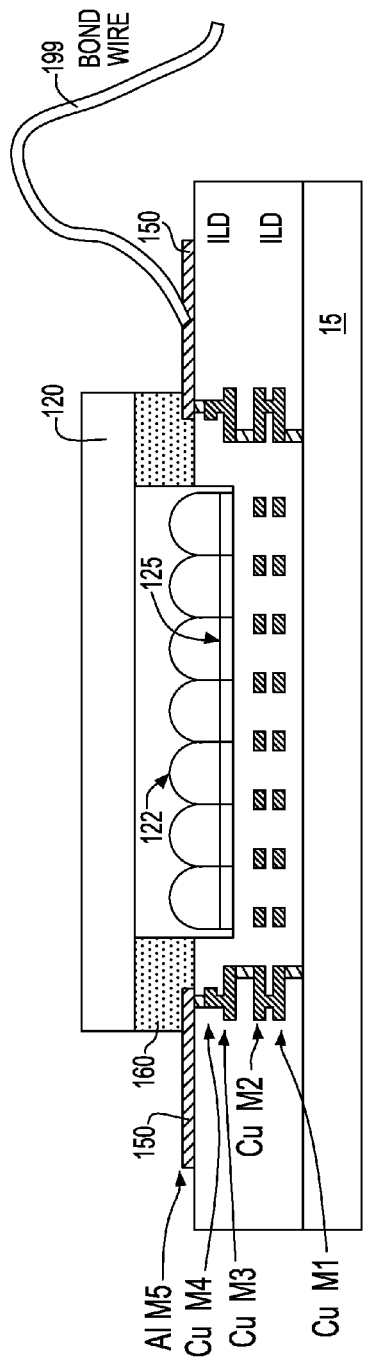
FIG. 5 depicts an alternative embodiment of the CMOS image sensor array showing packaging wire leads bonded to a bond pad surface.
Figure 6:
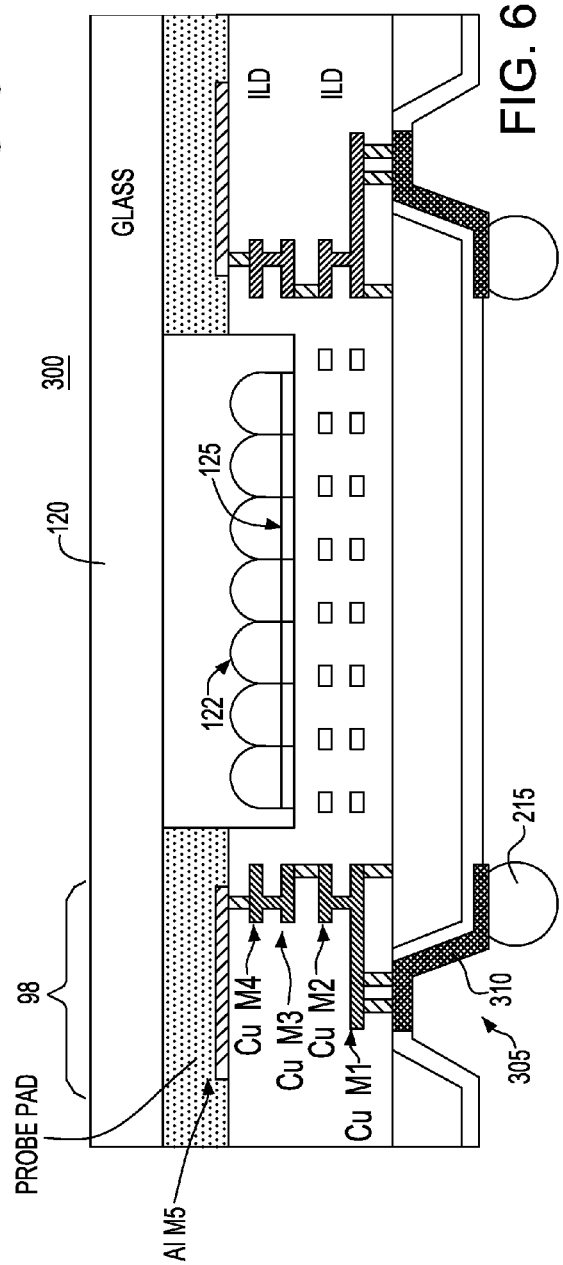
FIG. 6 illustrates, through a cross-sectional view, the packaging of the image sensor array in a Schott package configuration; and, FIG. 7 illustrates, through a cross-sectional view, the packaging of the image sensor array in a Shellcase package configuration.

As now shown in FIG. 5, in an alternative embodiment, there is performed the additional step of packaging the formed image sensor device. Particularly, as shown in FIG. 4D, there depicts the step of forming openings in the glass plate 120 and passivation layer 160, for example, by conventional etching processes that exposes the last metallization level, e.g., metallization level M5 comprising the Aluminum bonding pad 150. This forming of openings in glass plate for the wirebonding may occur either before or after glass plate bonding as conventionally known. Then, a conductor 199 (e.g. a bond wire) may be wirebonded to the bond pad layer 150 for attachment to an external circuit.

In an alternative embodiment, the packaging of the image array having recessed dielectric portion may comprise forming a Schott package configuration 300 utilizing semiconductor wafer level packaging technique may involve forming silicon-via-contacts 305 that enable direct access to the contact-and/or test-pads from the backside of the substrate 15. A photo resist mask applied to the backside of the silicon is used to define both, the position and size of the viaholes and the streets used to delineate dicing of the dies having respective formed image sensor arrays. The mask design as well as the thickness of the photo resist is optimized for the given silicon thickness. In one embodiment, tapered side-walls structures are etched in the underlying silicon substrate. The formed tapered via holes are etched by a highly customized plasma-etch process. As part of this process the interdielectric layer underneath the contact pads in a second plasma-etching step enables the direct electrical contact to the metallization pads, e.g., at the M1 level. Then, a sputter deposit of Ti:W/Cu material as an adhesion- and seed-layer for plating is performed. Starting from the contact-openings at the bottom of the via-holes leads 310 are formed that run up the tapered side-wall to the position of the corresponding contact pad of the formed metal contacts in the dense wiring region 98 of the imager array. The leads 310 are electro-plated with copper to a predetermined thickness (e.g., about 5.5 μm). These leads 310 may be electrically contacted with Ball Grid array contacts, e.g., solder balls 215, and conventional under-bump-metallurgy (not shown) to complete the Schott package 300 for the imager array. Further details regarding Schott packaging technique that can be used in accordance with the present invention for packaging the image sensor array with recessed dielectric can be found in the reference entitled "New Wafer-Level-Packaging Technology using Silicon-Via-Contacts For Optical And Other Sensor Applications" by Jürgen Leib, et al., in Electronic Components and Technology Conference, pp. 843-847 (2004), the whole contents and disclosure of which is incorporated by reference herein.

Figure 7:
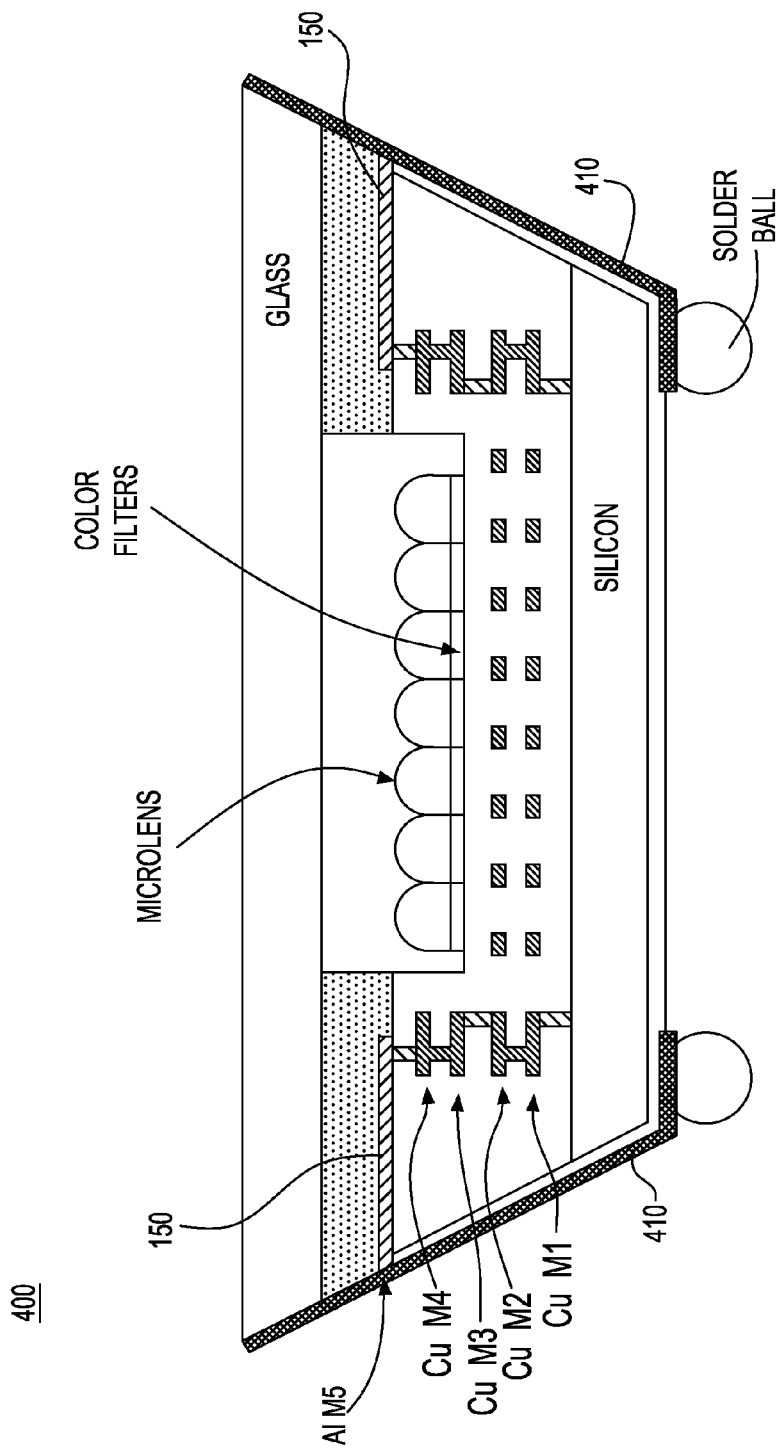

In an alternative embodiment, shown in FIG. 7, the packaging of the image array having recessed dielectric portion may comprise forming a Shellcase package configuration 400 utilizing semiconductor wafer level packaging techniques as known in the art. Particularly, from the final structure shown in FIG. 4D, substrate material between dies is etched away yielding individual IC's attached to the supporting cover. The grooves formed between the dies are filled with an inert material and a thin cover is bonded onto the backside of the silicon dies to achieve a complete protective enclosure for each die. Then deep notches are formed between the dies to expose the cross-section of the wire bond pads 150. A metal layer 410 is then formed so as to contact the metal pads at their cross sections. This metal layer 410 may be patterned by a lithographic process to form individual leads, contacting the pads and forming solder pads on the upper surface of the package. The contacts may then be plated, e.g., with gold or lead-tin. Finally, wafer dicing is performed to yield the individual packaged dies. Further details regarding ShellCase packaging technique that can be used in accordance with the present invention for packaging the image sensor array with recessed dielectric can be found in the reference entitled "CSP Optoelectronic package for Imaging and Light Detection Applications" by I. Schweky, Proceedings of SPIE—The International Society for Optical Engineering Vol. 3582, pp. 876-881 (1998), the whole contents and disclosure of which is incorporated by reference herein.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

Having thus described our invention, what we claim as new, and desire to secure by Letters Patent is:

1. A CMOS imager array comprising:
   a substrate;
   an array of light receiving pixel structures formed above said substrate, said array having formed therein "m" levels of conductive structures, each level formed in a corresponding interlevel dielectric material layer;
   a dense logic wiring region formed adjacent to said array of light receiving pixel structures having "n" levels of conductive structures, each level formed in a corresponding interlevel dielectric material layer, where n>m and where m=2 and n≧4; and
   a conductive element electrically connecting a final conductive structure of said dense logic wiring region to an external conductor, wherein said external conductor includes a solder element formed beneath said substrate as part of a ball grid array structure.

2. The imager array as claimed in claim 1, wherein said array of light receiving pixel structures comprises:

a microlens array having microlenses and color filters formed above said interlevel dielectric material layer, a microlens and respective color filter in alignment with a respective light receiving structure formed at a surface of said substrate.

3. The imager array as claimed in claim 2, wherein a top surface of said interlevel dielectric material layer beneath microlens array is recessed from a top surface of said interlevel dielectric material layers of said dense logic wiring region.

4. The imager array as claimed in claim 2, wherein a dense logic wiring region is formed at two opposing sides adjacent said pixel array region, said dense logic wiring region including a passivation layer formed at a top surface and having a final conductive structure.

5. The imager array as claimed in claim 4, further comprising:
a protective structure mounted to a top surface of said passivation structure at said two opposing sides, said protective structure and a top surface of said microlens array separated by a gap, wherein said gap providing additional protection of said microlens array during mounting of said protective structure.

6. The imager array as claimed in claim 5, wherein said mounted protective structure comprises a glass plate covering said array of light receiving pixel structures.

7. The imager array as claimed in claim 5, wherein said gap is about 10 microns or greater in thickness.

8. The imager array as claimed in claim 1, wherein said "n" levels of conductive structures at said dense logic wiring region are interconnected by via structures.

9. The imager array as claimed in claim 1, wherein said ball grid array structure is formed as part of a Schott integrated circuit package.

10. The imager array as claimed in claim 1, wherein said ball grid array structure is formed as part of a Shellcase integrated circuit package.

11. A CMOS imager array comprising:

a substrate;

an array of light receiving pixel structures formed above said substrate, said array having formed therein "m" levels of conductive structures, each level formed in a corresponding interlevel dielectric material layer; and a dense logic wiring region formed adjacent to said array of light receiving pixel structures having "n" levels of conductive structures, each level formed in a corresponding interlevel dielectric material layer, where n>m and where m=2 and n≧4.

* * * * *